US 6,710,852 B2

(12) United States Patent
Chen et al.

(10) Patent No.: US 6,710,852 B2
(45) Date of Patent: Mar. 23, 2004

(54) METHOD AND APPARATUS OF WAFER EXPOSURE WITH CORRECTION FEEDBACK

(75) Inventors: Cheng Ming Chen, Hsinchu (TW); Wen Hao Chang, Taoyuan Hsien (TW); Yun-Kuei Chiu, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/226,578

(22) Filed: Aug. 23, 2002

(65) Prior Publication Data

US 2003/0123034 A1 Jul. 3, 2003

(30) Foreign Application Priority Data

Dec. 28, 2001 (TW) .......................... 90133023 A

(51) Int. Cl.[7] .......................... G03B 27/42; G03B 27/52
(52) U.S. Cl. ........................... 355/53; 355/55
(58) Field of Search ................... 355/53, 55, 67–71, 355/77; 250/548; 356/399–401; 430/311

(56) References Cited

U.S. PATENT DOCUMENTS 4,734,746 A * 3/1988 Ushida et al. ................. 355/53
6,400,441 B1 * 6/2002 Nishi .......................... 355/53

* cited by examiner

Primary Examiner—Henry Hung Nguyen
(74) Attorney, Agent, or Firm—Ladas & Parry

(57) ABSTRACT

A method of wafer exposure with correction feedback. The method includes the steps of using a first group of parameters to expose the first wafer to transfer a pattern of a first layer, using a second group of parameters to perform overlay alignment of the pattern of the first layer with a pattern of a second layer for the first wafer, measuring the first wafer to obtain a first and second correction respectively for the first and second parameter groups correcting the first group with the first correction and using the corrected parameters to expose the second wafer to transfer the pattern of the first layer, and correcting the second group with the second correction and using the corrected parameters to perform overlay alignment of the pattern of the first layer with the pattern of the second layer for the second wafer.

8 Claims, 5 Drawing Sheets

1. Constants

| 1 | 2 | 3 | 4 | | | | | | | | |
|---|---|---|---|---|---|---|---|---|---|---|---|
| Kex | T | Kcd | Kc | | | | | | | | |
| 5 | 6 | 7 | 8 | 9 | 10 | 11 | 12 | 13 | 14 | 15 | 16 |
| Cxos | Cxoo | Cxoc | Cyos | Cyoo | Cyoc | Cxss | Cxso | Cxsc | Cyss | Cyso | Cysc |
| 17 | 18 | 19 | 20 | 21 | 22 | 23 | 24 | 25 | 26 | 27 | 28 |
| Cwors | Cworo | Cworc | Cwrs | Cwro | Cwrc | Cssxs | Cssxo | Cssxc | Cssvs | Cssvo | Cssvc |
| 29 | 30 | 31 | 32 | 33 | 34 | | | | | | |
| Csors | Csoro | Csorc | Csrs | Csro | Csrc | | | | | | |
| 36 | 37 | 38 | 39 | 40 | 41 | 42 | 43 | 44 | 45 | 46 | |
| Nex | Nxo | Nyo | Nxs | Nys | Nwor | Nwr | Nssx | Nssy | Nsor | Nsr | |
| 47 | 48 | 49 | 50 | 51 | | | | | | | |
| WWmin | PtId | Klot | CmatX | Cmaty | | | | | | | |

2. Parameters received by the processing device

| 1 | 1 | 2 | 3 | 4 | 5 | 6 | 7 | 8 | 9 | 10 | 11 |
|---|---|---|---|---|---|---|---|---|---|---|---|
| | Exposure Dose (mi/cm2) EXis | X Offset (um) XOis | Y Offset (um) YOis | X Scaling (ppm) XSis | Y Scaling (ppm) YSis | Wafer Orthogonality (urad) WORis | Wafer Rotation (urad) WRis | Shot Scaling X (ppm) SSXis | Shot Scaling Y (ppm) SSYis | Shot Orthogonality (ppm) SORis | Shot Rotation (urad) SRis |
| 2 | CD (um) CDi | XDio | YOio | XSio | YSio | WORio | WRio | SSXio | SSYio | SORio | SRio |

3. Parameters sent from the processing device

| 1 | 2 | 3 | 4 | 5 | 6 | 7 | 8 | 9 | 10 | 12 |
|---|---|---|---|---|---|---|---|---|---|---|
| Exposure Dose | X Offset | Y Offset | X Scaling | Y Scaling | Wafer | Orthogonality | Shot Scaling x | Shot Scaling Y | Shot Orthogonality | Shot Rotation |

FIG.4a

4. Equations $$ExposureDose = Kex(\sum_{i=1}^{Nex} EXis)/Nex + Kcd\left[T - (\sum_{i=1}^{Nex} CDi)/Nex\right] + Kc$$

$$X\ Offset = Cxos(\sum_{i=1}^{Nxo} XOis)/Nxo + Cxoo(\sum_{i=1}^{Nxo} XOio)/Nxo + Cxoc - CmatX(MatX)$$

$$Y\ Offset = Cyos(\sum_{i=1}^{Nyo} YOis)/Nyo + Cyoo(\sum_{i=1}^{Nyo} YOio)/Nyo + Cyoc - CmatY(MatY)$$

$$X\ Scaling = Cxss(\sum_{i=1}^{Nxs} XSis)/Nxs + Cxso(\sum_{i=1}^{Nxs} XSio)/Nxs + Cxsc$$

$$Y\ Scaling = Cyss(\sum_{i=1}^{Nys} YSis)/Nys + Cyso(\sum_{i=1}^{Nys} YSio)/Nys + Cysc$$

$$Wafer\ Orthogonality = Cwors(\sum_{i=1}^{Nwor} WORis)/Nwor + Cworo(\sum_{i=1}^{Nwor} WORio)/Nwor + Cworc$$

$$Wafer\ Rotation = Cwrs(\sum_{i=1}^{Nwr} WRis)/Nwr + Cwro(\sum_{i=1}^{Nwr} WRio)/Nwr + Cwrc$$

$$Shot\ Scaling\ X = Cssxs(\sum_{i=1}^{Nssx} SSXis)/Nssx + Cssxo(\sum_{i=1}^{Nssx} SSXio)/Nssx + Cxso(\sum_{i=1}^{Nxs} XSio)/Nxs + Cssxc$$

$$Shot\ Scaling\ Y = Cssxs(\sum_{i=1}^{Nssy} SSYis)/Nssy + Cssyo(\sum_{i=1}^{Nssy} SSYio)/Nssy + Cyso(\sum_{i=1}^{Nys} YSio)/Nys + Cssyc$$

$$Shot\ Orthogonality = Csors(\sum_{i=1}^{Nsor} SORis)/Nsor + Csoro(\sum_{i=1}^{Nsor} SORio)/Nsor + Cworo(\sum_{i=1}^{Nwor} WORio)/Nwor + Csorc$$

$$Shot\ Rotation = Csrs(\sum_{i=1}^{Nsr} SRis)/Nsr + Csro(\sum_{i=1}^{Nsr} SRio)/Nsr - Cwro(\sum_{i=1}^{Nwr} WRio)/Nwr + Csrc$$

FIG.4b

METHOD AND APPARATUS OF WAFER EXPOSURE WITH CORRECTION FEEDBACK

BACKGROUND OF THE INVENTION

1. Field of the Invention

The present invention relates to a method and apparatus of wafer exposure, particularly to a method and apparatus of wafer exposure with correction feedback.

2. Description of the Prior Art

Photolithography is one of the most important technologies in semiconductor manufacturing. It seriously affects structures of MOS devices, such as patterns of layers and doped regions. Typically, the number of masks used in photolithography indicates the complexity of a manufacturing process.

The exposure of wafers is generally implemented in a way of "Step and repeat" to accomplish a high resolution of patterns transferred to the wafers, wherein the size of the pattern on the mask is equal to or larger than that of the pattern transferred on the wafer. That is to say, the pattern on the mask is projected and minified on one of portions or blocks of the wafer. This is repeatedly implemented for the blocks on the wafer one by one until the whole wafer is exposed.

Only the pattern of one of layers is transferred to the wafer after each block of the wafer is exposed. There are many patterns of layers and corresponding masks involved in one manufacturing process. Therefore, addition to piece alignment between the blocks of the wafer, overlay alignment between the patterns of the layers is essential to the photolithography processing step.

However, performance of one exposure system always slightly varies with time. For a precisely accurate exposure, the wafers processed by the exposure system must be measured to obtain corrections for parameters (recipe) used by the exposure system. The recipe will be corrected and used by the exposure system to process the following wafers.

Conventionally, recipe correction is implemented manually. Pilot wafers are processed by the exposure system and then measured to obtain the corrections with some approximate calculations. However, this is time-consuming and easy to result in mistakes, which is disadvantageous to the throughput of the manufacturing process.

SUMMARY OF THE INVENTION

Therefore, the object of the present invention is to provide a method and apparatus of wafer exposure with auto-correction to eliminate the disadvantages resulting from manual operations.

The present invention provides a method of wafer exposure with correction feedback. The method comprises the steps of providing a first and second wafer, using a first group of parameters to expose the first wafer to transfer a pattern of a first layer to the first wafer, using a second group of parameters to perform overlay alignment of the pattern of the first layer with a pattern of a second layer for the first wafer, performing measurement of the first wafer to obtain a first and second correction respectively for the first and second group of the parameters, correcting the first group of the parameters with the first correction and using the first group of the corrected parameters to expose the second wafer to transfer the pattern of the first layer to the second wafer, and correcting the second group of the parameters with the second correction and using the second group of the corrected parameters to perform overlay alignment of the pattern of the first layer with the pattern of the second layer for the second wafer.

The present invention further provides an apparatus of wafer exposure with correction feedback. The apparatus comprises an exposure system using a first and second group of parameters to expose a first wafer to transfer a pattern of a first layer to the first wafer and to perform overlay alignment of the pattern of the first layer with a pattern of a second layer for the first wafer, respectively, and using the first and second group of corrected parameters to expose a second wafer to transfer the pattern of the first layer to the second wafer and to perform overlay alignment of the pattern of the first layer with the pattern of the second layer for the second wafer, respectively, a measurement system performing measurement of the first wafer to obtain a first and second correction for the first and second group of the parameters respectively, and a processing device correcting the first and second group of the parameters with the first and second correction, and sending the first and second group of the corrected parameters to the exposure system.

Thus, the corrected recipes are obtained by calculations of the processing device and automatically sent back to the exposure system. This avoids the manual operations which result in the disadvantages of the conventional exposure system.

BRIEF DESCRIPTION OF THE DRAWINGS

The following detailed description, given by way of example and not intended to limit the invention solely to the embodiments described herein, will best be understood in conjunction with the accompanying drawings, in which:

FIGS. 4a and 4b shows constants and equations for recipes according to one embodiment of the invention.

DETAILED DESCRIPTION OF THE INVENTION

Figure 1:
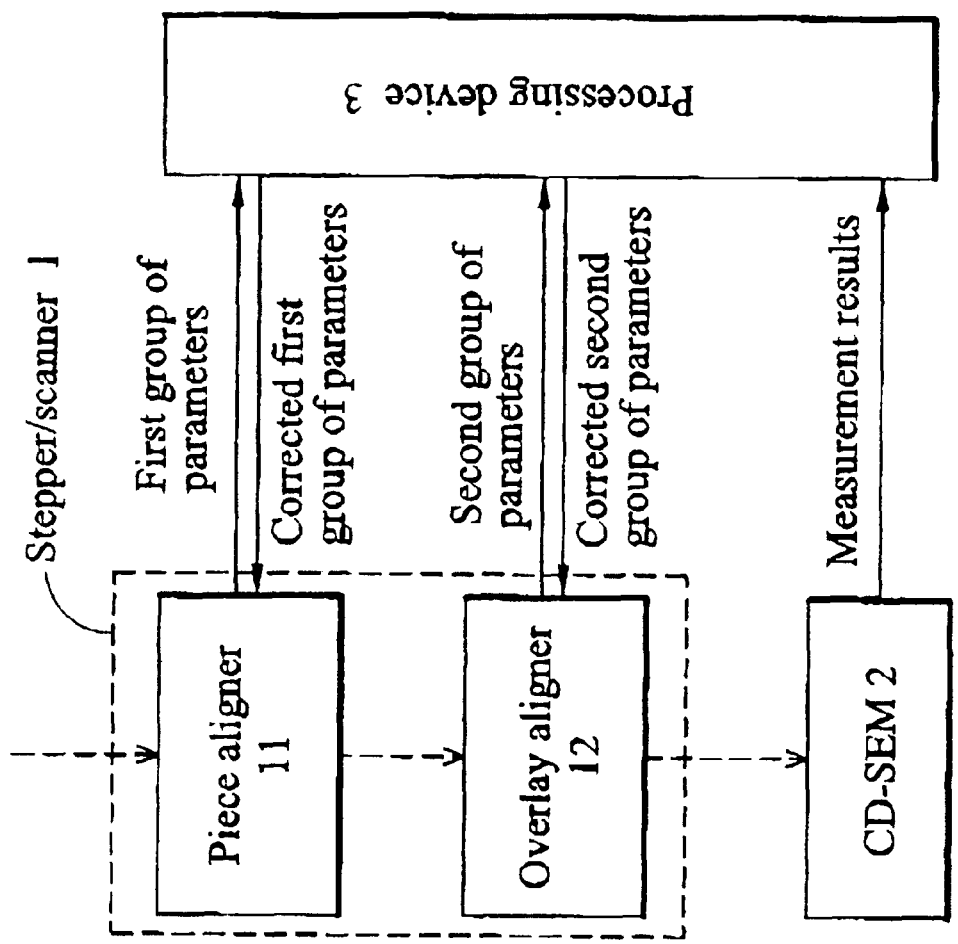
FIG. 1 is a diagram showing an apparatus of wafer exposure with correction feedback according to one embodiment of the invention.

FIG. 1 is a diagram showing an apparatus of wafer exposure with correction feedback according to one embodiment of the invention. The apparatus comprises an exposure system (stepper/scanner) 1, a scanning electron microscope (SEM) 2 and a processing device 3. The stepper/scanner 1 includes a piece aligner 11 and an overlay aligner 12 for implementation of piece alignment of blocks and overlay alignment of layers respectively.

The operation of the apparatus of this embodiment will be explained in the following.

Wafers are sent into the stepper/scanner 1 by lot in the direction of arrows shown in FIG. 1. The piece alignment, overlay alignment and measurement are implemented in turn for the wafers. The piece aligner 11 using an initial or corrected first group of parameters (a first recipe) to expose the wafers and perform the piece alignment of the blocks. The overlay aligner 12 using an initial or corrected second group of parameters (a second recipe) to perform the overlay alignment of the patterns of the layers. The SEM 2 measures the wafers processed by the aligner 11 and 12, and produces and sends an exposure and alignment result to the processing device 3. The processing device 3 further receives the first and second group of the parameters from the exposure system 1, and obtains corrections for them by calculations with the exposure and alignment result. Then, the first and second group of the parameters are corrected by the processing device 3. The corrected parameters are sent back from the processing device 3 to the exposure system 1 for the exposure, piece alignment and overlay alignment of the following lot of wafers.

FIGS. 4a and 4b shows constants and equations for the first and second group of the parameters.

Figure 2:
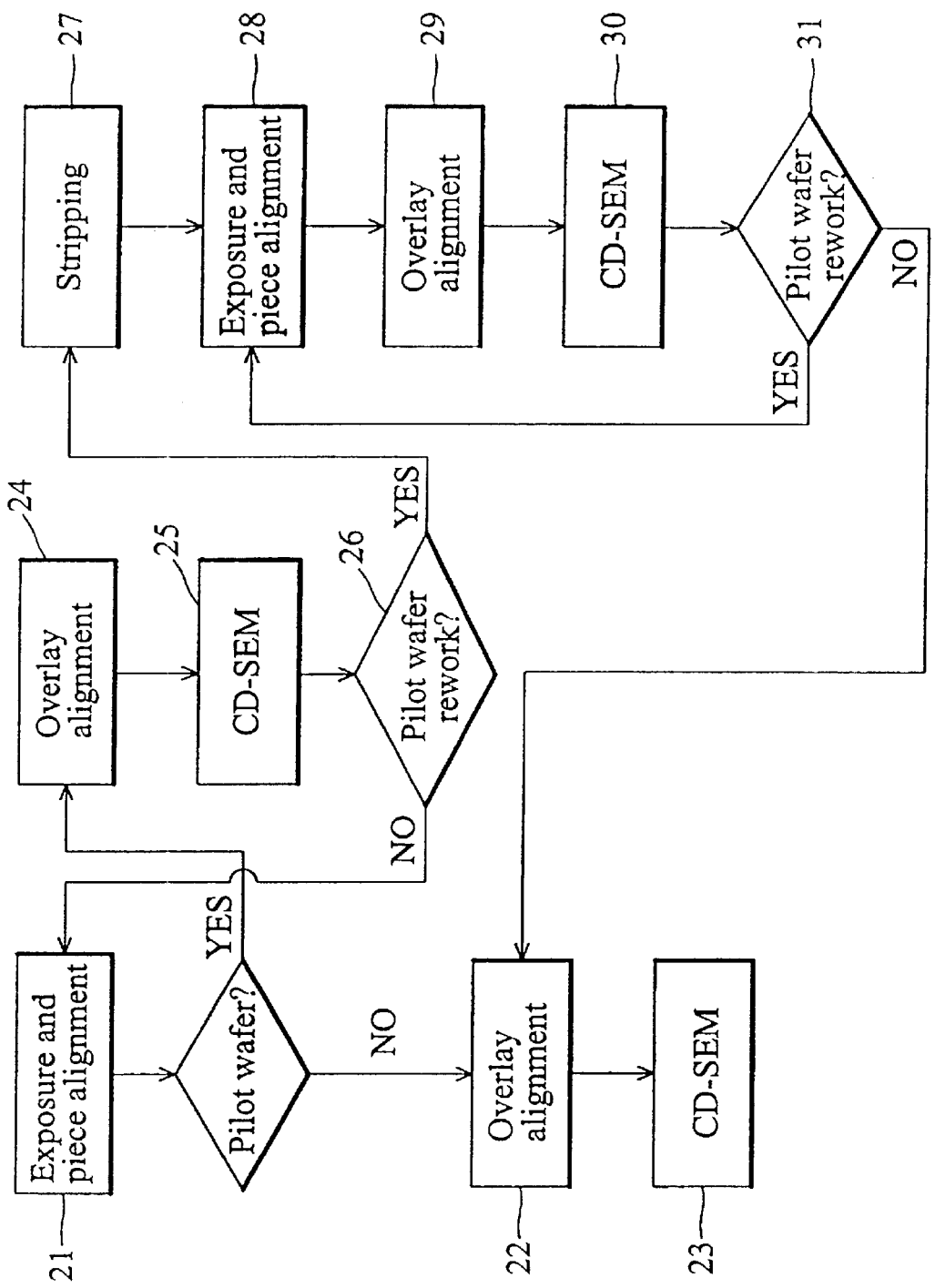
FIG. 2 is a flowchart of a processing procedure of the wafer according to one embodiment of the invention.

FIG. 2 is a flowchart of a processing procedure of the wafer according to one embodiment of the invention.

In step 21, exposure and piece alignment of the wafer are implemented in the exposure system. A sub-route composed of steps 24, 25 and 26 is implemented if the wafer is a pilot wafer and the exposure system needs to be retested; otherwise, steps 22 and 23 are implemented. In step 26, the operator must decide whether a rework is necessary for the pilot wafer. The corrected recipes obtained using the pilot wafer is sent back to the exposure system if the rework is not needed; otherwise, a sub-route for rework composed of steps 27, 28, 29 and 30 is implemented. In step 31, the operator must decide whether a further rework is necessary for the pilot wafer. The sub-route for rework is implemented again if the further rework is needed; otherwise, steps 22 and 23 are implemented.

Figure 3:
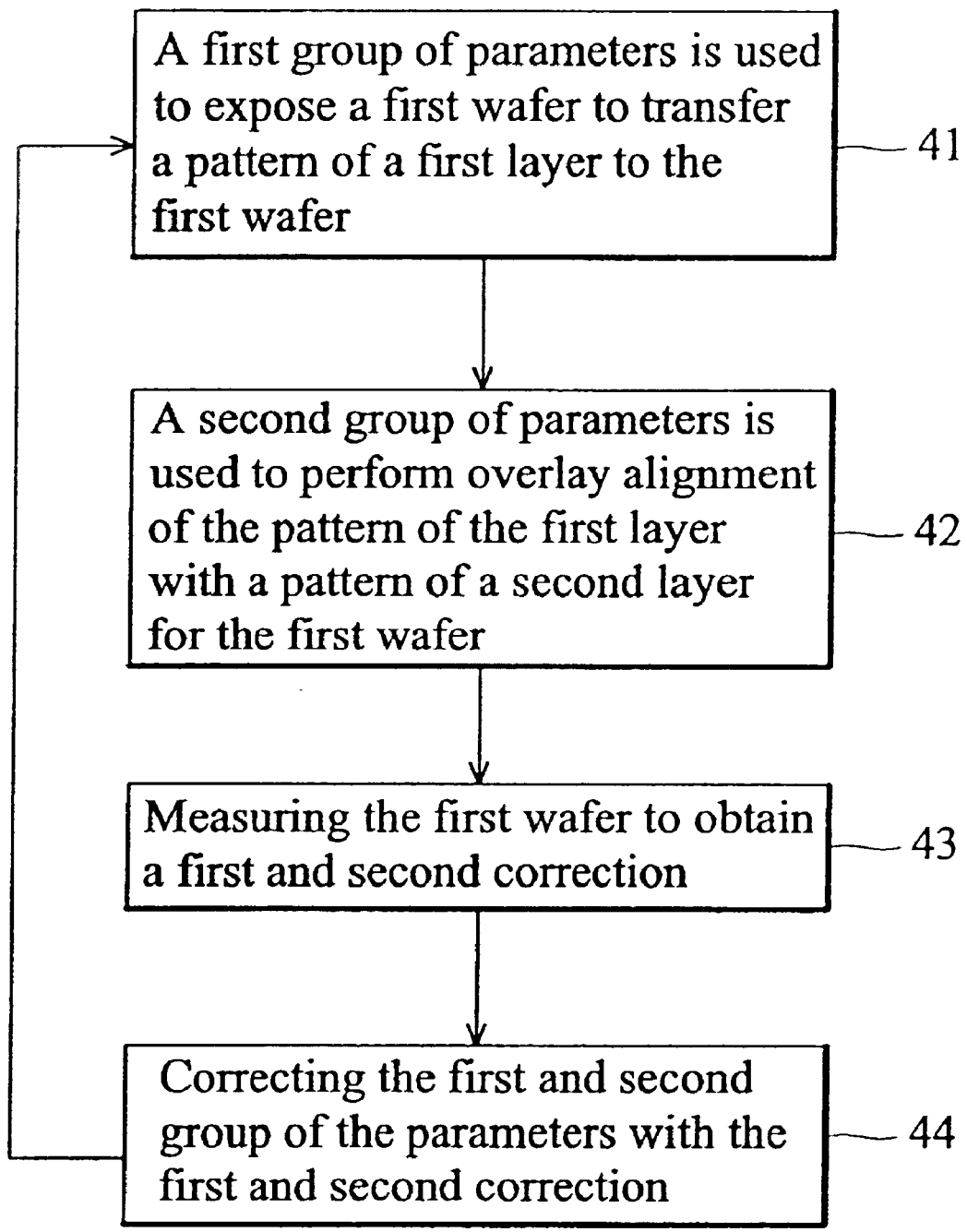
FIG. 3 is a flowchart of a method of wafer exposure with correction feedback according to one embodiment of the invention.

FIG. 3 is a flowchart of a method of wafer exposure with correction feedback according to one embodiment of the invention.

In step 41, a first group of parameters is used to expose a first wafer to transfer a pattern of a first layer to the first wafer.

In step 42, a second group of parameters is used to perform overlay alignment of the pattern of the first layer with a pattern of a second layer for the first wafer.

In step 43, measurement of the first wafer is performed to obtain a first and second correction respectively for the first and second group of the parameters.

In step 44, correcting the first and second group of the parameters with the first and second correction respectively.

Then, for a second wafer, the first group of the corrected parameters is used to expose the second wafer to transfer the pattern of the first layer to the second wafer, and the second group of the corrected parameters are used to perform overlay alignment of the pattern of the first layer with the pattern of the second layer. The steps 41~44 are repeated for the second wafer.

In conclusion, the present invention provides a method and apparatus of wafer exposure with auto-correction. The corrected recipes are obtained by calculations of the processing device and automatically sent back to the exposure system. This avoids the manual operations which result in the disadvantages of the conventional exposure system.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of wafer exposure with correction feedback comprising the steps of:

providing a first and second wafer;

using a first group of parameters to expose the first wafer to transfer a pattern of a first layer to the first wafer;

using a second group of parameters to perform overlay alignment of the pattern of the first layer with a pattern of a second layer for the first wafer;

performing measurement of the first wafer to obtain a first and second correction respectively for the first and second group of the parameters;

correcting the first group of the parameters with the first correction and using the first group of the corrected parameters to expose the second wafer to transfer the pattern of the first layer to the second wafer; and correcting the second group of the parameters with the second correction and using the second group of the corrected parameters to perform overlay alignment of the pattern of the first layer with the pattern of the second layer for the second wafer.

2. The method as claimed in claim 1, wherein the first and second wafer are exposed by a stepper.

3. The method as claimed in claim 1, wherein the first and second wafer are exposed by a scanner.

4. The method as claimed in claim 1, wherein the measurement of the first wafer is performed by a scanning electron microscope.

5. An apparatus of wafer exposure with correction feedback comprising:

an exposure system using a first and second group of parameters to expose a first wafer to transfer a pattern of a first layer to the first wafer and to perform overlay alignment of the pattern of the first layer with a pattern of a second layer for the first wafer, respectively, and using the first and second group of corrected parameters to expose a second wafer to transfer the pattern of the first layer to the second wafer and to perform overlay alignment of the pattern of the first layer with the pattern of the second layer for the second wafer, respectively;

a measurement system performing measurement of the first wafer to obtain an exposure and alignment result; and a processing device obtaining a first and second correction by calculations with the exposure and alignment result respectively, correcting the first and second group of the parameters with the first and second correction, and sending the first and second group of the corrected parameters to the exposure system.

6. The apparatus as claimed in claim 1, wherein the exposure system is a stepper.

7. The apparatus as claimed in claim 1, wherein the exposure system is a scanner.

8. The method as claimed in claim 1, wherein the measurement system is a scanning electron microscope.

* * * * *